(12) United States Patent
Srivastava

(10) Patent No.: US 6,930,500 B2
(45) Date of Patent: Aug. 16, 2005

(54) IDDQ TESTING OF CMOS MIXED-SIGNAL INTEGRATED CIRCUITS

(75) Inventor: Ashok Srivastava, Baton Rouge, LA (US)

(73) Assignee: Board of Supervisors of Louisiana State University And Agricultural and Mechanical College, Baton Rouge, LA (US)

(*) Notice: Subject to any disclaimer, the term of this patent is extended or adjusted under 35 U.S.C. 154(b) by 0 days.

(21) Appl. No.: 10/858,189

(22) Filed: Jun. 1, 2004

(65) Prior Publication Data

US 2005/0024075 A1 Feb. 3, 2005

Related U.S. Application Data

(60) Provisional application No. 60/492,139, filed on Aug. 1, 2003.

(51) Int. Cl.[7] .............................................. G01R 31/02
(52) U.S. Cl. ..................................... 324/763; 324/158.1
(58) Field of Search ................................ 324/765, 763, 324/158.1, 769, 73.1, 760, 767, 768; 714/730, 333; 257/48

(56) References Cited

U.S. PATENT DOCUMENTS

| | | | |
|---|---|---|---|
| 5,392,293 A | * 2/1995 | Hsue | ........................... 324/765 |
| 5,581,563 A | 12/1996 | Penza et al. | ................ 371/22.1 |
| 5,726,997 A | 3/1998 | Teene | ........................ 371/22.3 |
| 5,757,203 A | 5/1998 | Brown | ........................ 324/765 |
| 5,929,650 A | 7/1999 | Pappert et al. | .............. 324/763 |
| 5,949,798 A | 9/1999 | Sakaguchi | .................. 714/738 |
| 6,144,214 A | * 11/2000 | Athan | ......................... 324/763 |
| 6,400,171 B2 | * 6/2002 | Bryant et al. | ................ 324/763 |
| 6,593,765 B1 | * 7/2003 | Ishida et al. | ................. 324/765 |

OTHER PUBLICATIONS

Arabi, K. "Design for Testability of Embedded Integrated Operational Amplifiers," *IEEE J. of Solid State Circuits*, vol. 33, pp. 573–581 (1998).

Arabi, K. et al., "Testing Analog and Mixed–Signal Integrated Circuits using Oscillation–Test Method," *IEEE. Trans. on Computer–Aided Design of Integrated Circuits and Systems*, pp. 745–753 (1997).

(Continued)

*Primary Examiner*—Vinh Nguyen
*Assistant Examiner*—Tung X. Nguyen
(74) *Attorney, Agent, or Firm*—John H. Runnels; Bonnie J. Davis; André J. Porter

(57) ABSTRACT

A method of enhancing the testability of CMOS ICs, in one or more of the following ways: by minimizing performance degradation of CMOS ICs under test; by eliminating the need for external voltage and current references; by inducing responsive effects; and by minimizing the amount of space used to integrate on-chip testing devices. The device is a CMOS IC comprising a fixed supply voltage, a negative power supply voltage, at least one pair of electrical nodes, and at least one fault-injector. The fault-injector is a transistor comprising a gate for operating in on-state and off-state conditions, and a source node and a drain node for completing an electrical path between a pair of electrical nodes. In an off-state condition, the fault-injector does not interfere with the normal operations of the circuit. However, in an on-state condition, it induces various responsive effects by varying the level of resistance.

10 Claims, 17 Drawing Sheets

OTHER PUBLICATIONS

Brown, B.D. et al., "Built–In Current Mode Circuits for $I_{DDQ}$ Monitoring," *Proc. IEEE. CICC*, pp. 30.6.1–4 (1993).

Dufort, B. et al., "On–Chip Analog Signal Generation for Mixed–Signal Built in Self–Test," *IEEE J. Solid–State Circuits*, vol. 34, pp. 318–330 (1999).

Hsue, C. W. et al., "Built–In Current Sensor for $I_{DDQ}$ Test in CMOS," *Proc. Int. Test Conf., ITC'93*, pp. 635–641 (1993).

Maly, W. et al., "Design of IC's Applying Built–In Current Testing," *J. Electr. Testing: Theory Appl.*, vol. 3, pp. 397–406 (1992).

Pan, C.Y. et al., "*Pseudorandom* Testing for Mixed–Signal Circuits," *IEEE Trans. on Computer–Aided Design of Integrated Circuits and Systems*, vol. 16, pp. 1173–1185 (1997).

Rajsuman, R., $I_{DDQ}$ *Testing for CMOS VLSI*, pp. 21–49 (Artech House, London, 1995).

Siskos, S. et al., "A Current Conveyer Based BIC Sensor for Current Monitoring in Mixed–Signal Circuits," *Proc. ICECS'96*, pp. 1210–1212, (1996).

Srivastava, A. et al., A Novel Approach to $I_{DDQ}$ Testing of Mixed–Signal Integrated Circuits (research report) presented at the $45^{th}$ IEEE International Midwest Symposium on Circuits & Systems, 4 pgs. (Aug. 4–7, 2002).

Srivastava, A. et al., Improved Fault Coverage of Combined Oscillation and IDDQ Testing of a CMOS Amplifier Circuit at Liquid Nitrogen Temperature (research report) on file with the Louisiana State University Department of Electrical Engineering, pp. 1–29 (May, 2004).

\* cited by examiner

Fault-Injection Transistor
(n-MOSFET)

Example: Fault-injection transistor at the CMOS inverter output

IDDQ TESTING OF CMOS MIXED-SIGNAL INTEGRATED CIRCUITS

This invention pertains to a simple, inexpensive device and method of enhancing the testability of integrated circuits, e.g., complementary metal-oxide semiconductor ("CMOS") integrated circuits ("ICs"), in one or more of the following ways: by minimizing performance degradation of circuits under test; by eliminating the need for external voltage and current references; by inducing responsive effects; and by minimizing space used to integrate on-chip testing devices.

Testability of integrated circuits (e.g., digital, analog, and mixed-signal circuits) has become a dominant aspect of semi-conductor chip design. Semi-conductor chip testing may be performed at several levels such as the chip level which allows for the detection of faulty chips, and the board and system levels which allow for pinpointing of faults for repair purposes. Faults have physical causes referred to as "defects," which generally are caused by impurities and dust particles. These defects, which are typically introduced during chip fabrication, are translated into electrical faults that produce logical errors. The importance of effective and efficient circuit testing is indicative by the fact that approximately 50% of the purchase costs of some chips (e.g., high density memory chips) are directly related to costs associated with testing. Frequent testing of chips in various stages of manufacture is very important in minimizing fabrication costs and improving quality. However, to minimize costs associated with testing, testing techniques that enhance fault coverage while minimizing performance degradation are needed. See The Internet Page: "Testing of Digital Systems"

Current IC testing methods require the integration of additional circuits, which increases component density. Increased component density often causes logic delays, which reduce the operational speed of the circuit from its designed speed. There are several fundamentally different methods for testing ICs such as conventional logic means, functional testing methodology, design for testability, oscillation testing, built-in self testing, and steady state/quiescent state current testing.

Conventional logic testing is a method for detecting faults that cause logic errors in digital circuits under test ("CUT") by observing the output logic values of the CUT. However, this testing method is ineffective in detecting physical defects that often manifest into faults at early stages in a circuit's useful life such as gate-oxide shorts, floating gates and bridging faults. In addition, conventional logic testing is designed specifically to test digital circuits, and thus is ineffective in testing CMOS IC analog circuits and mixed signal circuits.

The functional testing method, which is based on empirical development of a test procedure, is typically applied in analog and mixed-signal IC testing. The empirical approach involves the fabrication and testing of a large number of sample circuits to collect data and form data correlations, so that basic vectors can be used to determine performance levels. A major disadvantage with this method is that it does not have any inherent test metric to measure the achievement of a test goal because of the large number of performance specifications of each circuit. See C. Y. Pan, et al., "Pseudorandom Testing for Mixed-Signal Circuits," *IEEE Trans. on Computer-Aided Design of Integrated Circuits and Systems*, vol. 16, pp. 1173–85 (1997).

Design for testability is another method for testing analog and mixed-signal ICs. In this method, rules compatible with other forms of testing such as direct current testing and power supply current monitoring have been developed to increase the controllability and observability of the circuit under test. See K. Arabi, "Design for Testability of Embedded Integrated Operational Amplifiers," *IEEE J. of Solid State Circuits*, vol. 33, pp. 573–581 (1998).

Oscillation testing is another method for testing analog and mixed-signal ICs. This method is based on a design-for-testability technique, which involves partitioning a complex analog circuit into functional building blocks or a combination of functional blocks, and converting each building block into an oscillation circuit by adding additional circuits. Fault is detected by determining the change in oscillation frequency. A major disadvantage of this method is performance degradation. See K. Arabi, et al., "Testing Analog and Mixed-Signal Integrated Circuits using Oscillation-Test Method," *IEEE. Trans. on Computer-Aided Design of Integrated Circuits and Systems*, pp. 745–753 (1997).

Built-in self-test method ("BIST") is another method of testing analog and mixed-signal ICs by measuring the output data and calculating the performance of the system using an on-chip circuitry. In BIST, all or some parts of the test circuitry are built onto the chip to reduce the testing complexity of mixed-signal integrated circuits. A major disadvantage in this method is that it causes performance degradation, and does detect physical defects. See B. Dufort, et al., "On-Chip Analog Signal Generation for Mixed-Signal Built in Self-Test," *IEEE J. Solid-State Circuits*, vol. 34, pp. 318–330 (1999).

Steady state or quiescent current ("$I_{DDQ}$") testing is a method of testing digital, analog, and mixed-signal CMOS ICs. This testing methodology allows for the detection of physical defects, including gate-oxide shorts, floating gates and bridging faults (i.e., short-circuit faults), by introducing either a metal short between circuit terminals for static testing or a diode to bypass the transient power buss current. Bridging may occur in any two electrical nodes, as well as in multiple nodes. See S. Siskos, et al., "A Current Conveyer Based BIC Sensor for Current Monitoring in Mixed-Signal Circuits," *Proc. ICECS'96*, pp. 1210–1212, (1996).

$I_{DDQ}$ testing also allows for the detection of faults that pose circuit reliability risks by detecting defects that often manifest into functional failures during the early stages of a circuit's life. In analog circuits, fault conditions may be detected by monitoring improper fluctuations in the normal quiescent current ("$I_{PS}$;" often measured in $\mu$As or mAs) on the power supply lines, using a current sensing circuit such as a built-in current sensor ("BICS"), as shown in FIG. 1. See W. Maly, et al., "Design of IC's Applying Built-In Current Testing," *J. Electr. Testing: Theory Appl.*, vol. 3, pp. 397–406 (1992); B. D. Brown, et al., "Built-In Current Mode Circuits for $I_{DDQ}$ Monitoring," *Proc. IEEE. CICC*, pp. 30.6.1–4 (1993); and C. W. Hsue, et al., "Built-In Current Sensor for $I_{DDQ}$ Test in CMOS," *Proc. Int. Test Conf., ITC'93*, pp. 635–641 (1993).

Studies have shown that $I_{DDQ}$ testing improves physical defect testing of digital, analog and mixed-signal circuits by increasing the fault coverage. The combining of quiescent state current ("$I_{DDQ}$") testing and conventional logic testing has developed into an effective means of testing ICs because it allows for the detection of both logic errors and physical defects.

R. Rajsuman, $I_{DDQ}$ *Testing for CMOS VLSI*, pp. 21–49 (Artech House, London, 1995) discloses a method of testing MOS transistors in CMOS circuits using an $I_{DDQ}$ testing method, which involves connecting a resistor between a gate-source, a gate-drain, a source-drain and a gate-oxidesubstrate to simulate bridging faults. A metal bridge, which gives a hard short (i.e., very low resistance) condition, is typically used to simulate the bridging faults. However, a hard short condition is not necessary to simulate a bridging fault. A major disadvantage with this method is that the resistance value is fixed and cannot be adjusted to simulate other shorts with high resistance.

U.S. Pat. No. 5,929,650 describes a device and method for detecting defective complementary metal-oxide semiconductor devices by implementing quiescent current testing using a single pin power provider. In an alternative embodiment, allows for the implementation of parallel switches using large P-channel pull-ups. In another embodiment, a linear feed-back shift register is used for provision of test signals to the integrated circuit.

U.S. Pat. No. 5,949,798 describes a device and method for detecting troubles in complementary metal-oxide semiconductor integrated circuits by creating a short-time check for a quiescent current using a test pattern application comprising a means for applying a test pattern to the integrated circuit under test, a current detection means, and a means for deriving a power spectrum of the supply current detected by the current detection means. In another embodiment, the quiescent current is observed using a test pattern comprising a tester for applying the test pattern to the integrated circuit under test, a test pattern storing means, a program storing means, a power supply unit, a current detection unit, an amplifier, a power spectrum analyzing means, and a checking means.

U.S. Pat. No. 5,757,203 describes a device for detecting fault in integrated circuits by measuring quiescent current in the integrated circuit using multiple integral quiescent current detectors for sampling the current drawn by selected portions of the integrated circuit under test.

U.S. Pat. No. 5,726,997 describes a device and method for testing for standard cell and gate array integrated circuits by monitoring and testing quiescent current in the integrated circuit at various points within an array of cells using quiescent current test circuitry embedded into the array of cells.

U.S. Pat. No. 5,581,563 describes a device for detecting bridging faults in complementary metal-oxide semiconductor and bi-complementary metal-oxide semiconductor logic integrated circuits by monitoring the presence of intermediate voltages at signal nodes of the integrated circuits using integrated monitoring inverters.

An unfilled need exists for a device and method of enhancing the testability of ICs, in one or more of the following ways: by minimizing performance degradation of circuits under test; by eliminating the need for external voltage and current references; by inducing responsive effects; and by minimizing space used to integrate on-chip testing devices.

I have discovered a simple, inexpensive method of enhancing the testability of CMOS ICs, in one or more of the following ways: by minimizing performance degradation of CMOS ICs under test ("CUT"); by eliminating the need for external voltage and current references; by inducing responsive effects; and by minimizing the amount of space used to integrate on-chip testing devices. Compared to prior devices and methods for testing CMOS ICs, the novel device and method also allow for simulating physical defects in functioning CMOS ICs at various frequencies and lengths of time. The device is a CMOS IC comprising a fixed supply voltage ("$V_{DD}$"), a negative power supply voltage ("$V_{SS}$;" normally ground (0 V)), at least one pair of electrical nodes, and at least one fault-injector. The fault-injector is a transistor comprising a gate for operating in on-state and off-state conditions, and a source node and a drain node for completing an electrical path between a pair of electrical nodes. The resistance level between the source node and the drain node can be decreased by increasing the amount of voltage supplied to the gate. In an off-state condition, the fault-injector does not interfere with the normal operations of the circuit. However, in an on-state condition, it induces various responsive effects by varying the level of resistance.

In one embodiment, the fault-injector, operating in an on-state condition with a $V_{DD}$ supplied to its gate, simulates physical defects (e.g., gate-drain, source-drain, gate-source, and gate-oxide-substrate shorts, and internal bridging faults) that typically occur when there exists a low resistance (<500 ohm) path between the source and drain nodes. When the $V_{DD}$ is removed, the fault injector is switched to an off-state condition allowing the IC to resume normal operations without any electrical interference (i.e., physical defects caused by resistance between the source and drain nodes).

Figure 1:
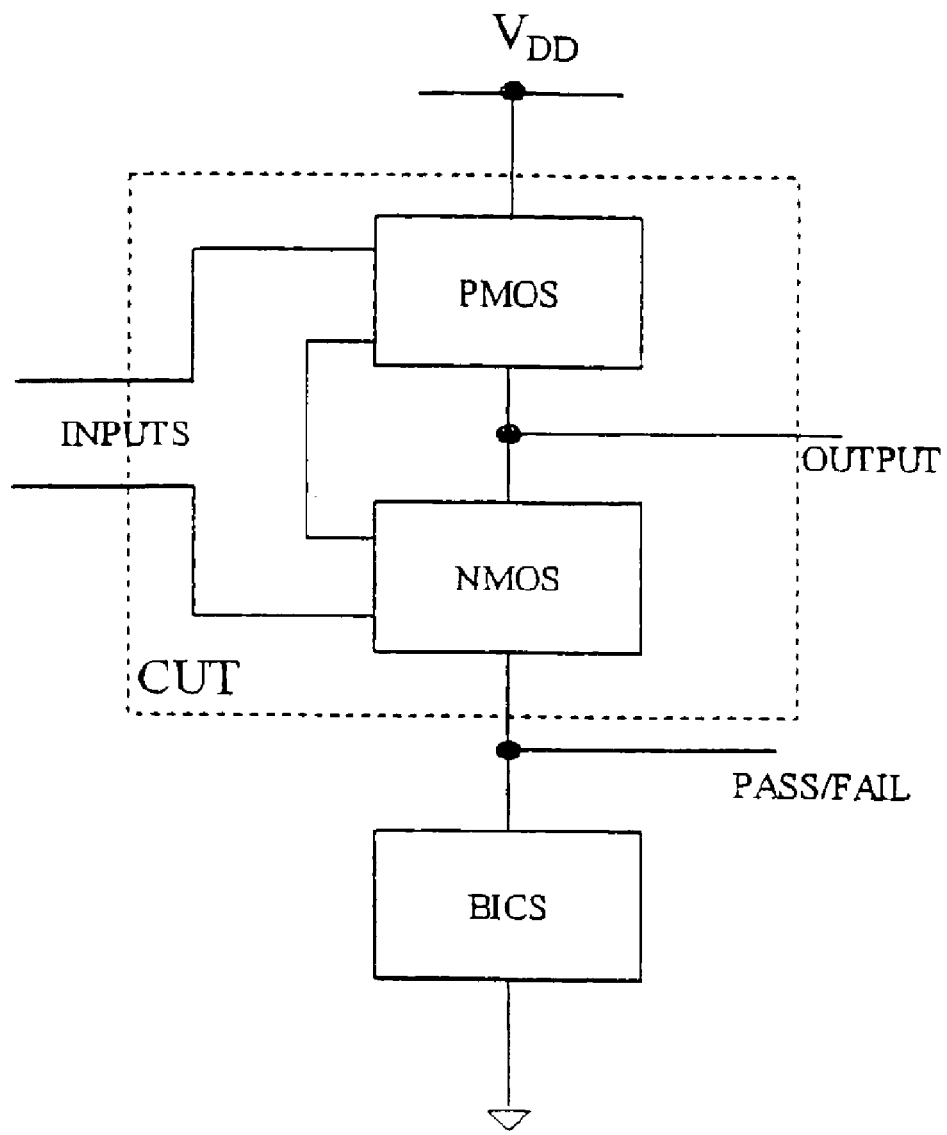
FIG. 1 illustrates a block diagram of one technique that allows for $I_{DDQ}$ testing using a BICS connected in series with the CUT.

This invention provides a reliable, inexpensive method for simulating physical defects in functioning ICs. The invention may be used to improve the testability of CMOS ICs, including mixed-signal, analog, and digital circuits. The basic design of the device is that of a conventional CMOS IC comprising a $V_{DD}$, a $V_{SS}$, and at least one pair of electrical nodes. In a preferred embodiment, to enhance the testability of the CMOS IC, the basic design further comprises at least one fault-injector having a gate attached to the $V_{DD}$ for operating in on-state and off-state (i.e., gate not connected to the $V_{DD}$) conditions, and a source node and a drain node for completing an electrical path between the pair of electrical nodes in the CMOS IC. The fault injector is a transistor capable of providing varying, low magnitudes of resistance, while minimizing space used to integrate on-chip testing devices such as an n-channel MOS field effect transistor ("n-MOSFET"). The resistance magnitude produced by the fault injector is adjusted by varying the voltage supplied to the gate from $V_T$ (approximately 0.2 $V_{DD}$) to $V_{DD}$.

In an alternative embodiment, a p-channel MOS field effect transistor ("p-MOSFET") may be used as the fault injector when on-chip space is not limited. (To achieve the resistance magnitude produced by an n-MOSFET, the p-MOSFET has to be almost twice the size of the n-MOSFET.) In this embodiment, resistance magnitudes are changed by connecting the gate to the $V_{SS}$.

In both the n-MOSFET and the p-MOSFET, if the voltage is removed, the fault injector is switched to an off-state condition allowing the IC to resume normal operations without any electrical interference, i.e., physical defects caused by resistance between the source and drain nodes.

In another embodiment, the testability of CMOS ICs may be further improved by combining oscillation testing and quiescent supply current ($I_{DDQ}$) testing. The testing methodology, which is more fully described in A. Srivastava, et al., *Improved Fault Coverage of Combined Oscillation and IDDQ Testing of a CMOS Amplifier Circuit at Liquid Nitrogen Temperature* (research report) on file with the Louisiana State University Department of Electrical Engineering (May, 2004) takes the advantage of improved fault coverage at 77 K compared to room temperature-based testing by converting the integrated circuit into an oscillator circuit to achieve a testing speed up to about 1 MHz.

There are several advantages to using this device to simulate physical defects in circuits. First, the number of components may be minimal. Fabrication may be simple and inexpensive. Second, the device allows for physical defect testing in functional circuits, i.e., digital, analog, and mixed-signal ICs, at various frequencies and lengths of time by increasing the voltage supplied to the fault injector's gate above its threshold voltage ("$V_T$"; i.e., the amount of voltage required to switch on the fault injector), instantaneously (0 sec) or over a length of time. Third, the device minimizes performance degradation of circuits under test by reducing the amount of parasitic capacitances. Fourth, the need for external voltages and current references is eliminated. The fault injector's gate can be biased using the circuit's internal $V_{DD}$. Fifth, the device allows for the inducement of responsive effects by monitoring the circuit's dynamic performance, and comparing the performance to normal dynamic performances. Sixth, on-chip space for integrating on-chip testing is minimized due to the use of relatively small-sized fault injectors.

EXAMPLE 1

Figure 2A:
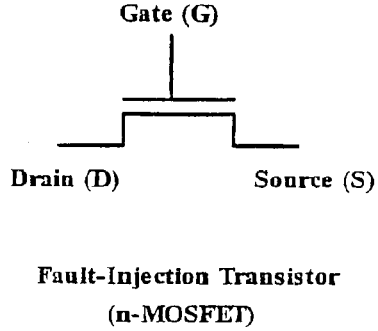
FIG. 2A illustrates a circuit level diagram of one embodiment of the fault injector.
Figure 2B:
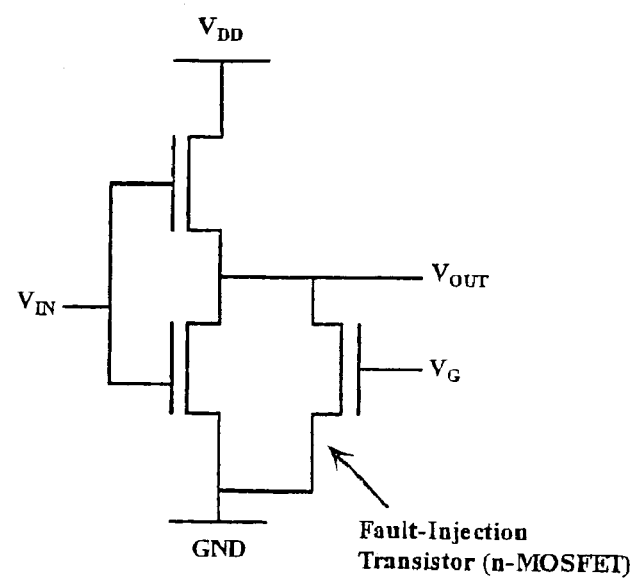
FIG. 2B illustrates a circuit level diagram of one embodiment of the fault injector at the inverter output of a CMOS IC.

FIGS. 2A and 2B illustrate a circuit level diagram of one embodiment of the fault injector in accordance with the present invention. FIG. 2A shows a fault-injector (n-MOSFET) having a source node, a drain node, and a gate for operating in on-state and off-state conditions. FIG. 2B shows a fault-injector (n-MOSFET) connected to the inverter output of a CMOS IC. To facilitate defect simulation, the gate is connected to a $V_{DD}$ to simulate a bridging fault between a pair of electrical nodes in a CMOS IC by introducing resistance between the electrical nodes. The level of resistance may be adjusted by varying the $V_{DD}$ from between $V_T$ (approximately 0.2 $V_{DD}$) to $V_{DD}$.

Figure 3:
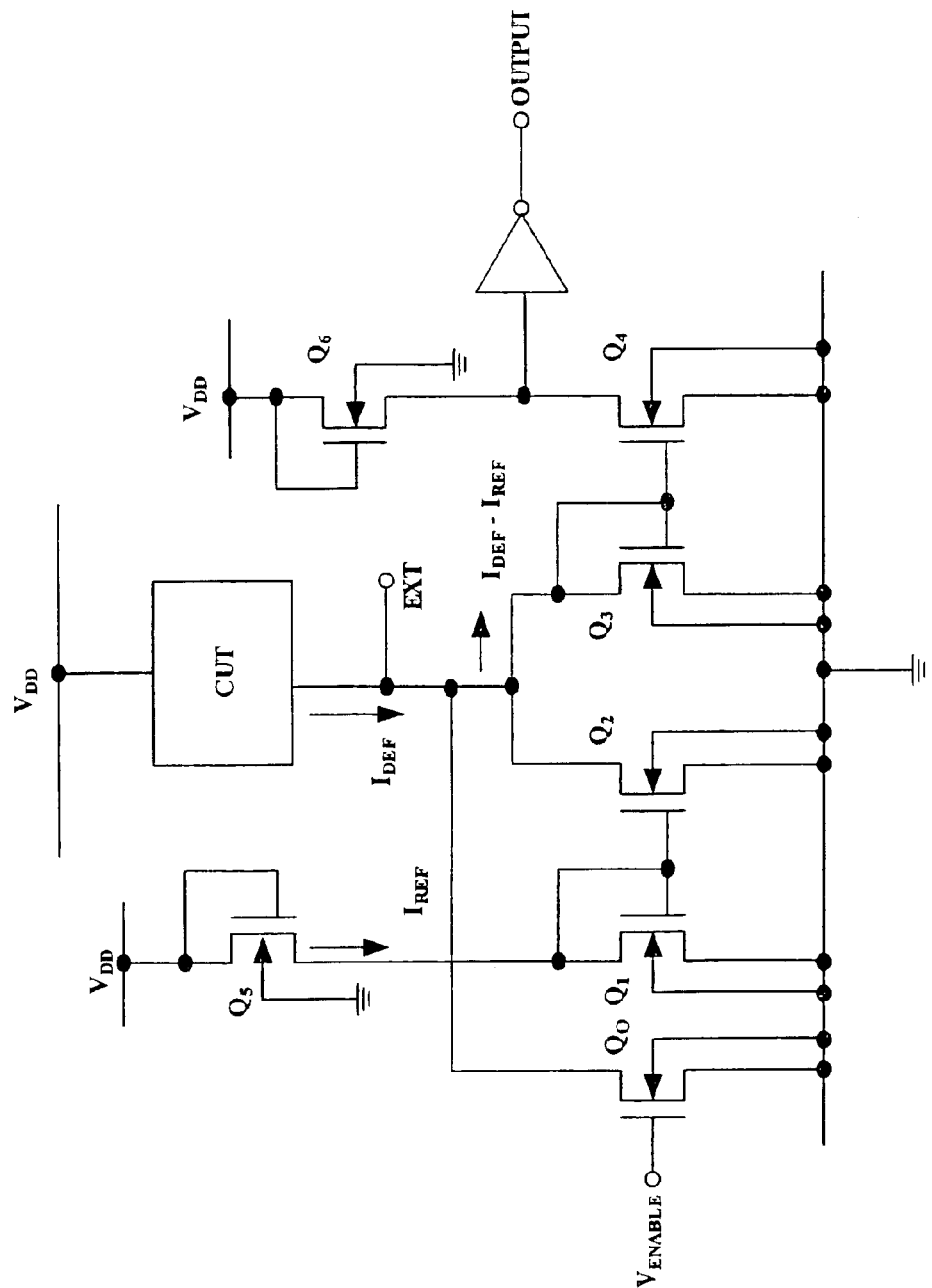
FIG. 3 illustrates a circuit level diagram of a BICS that that allows for supply current monitoring and testing of CUTs.

FIG. 3 illustrates a circuit level diagram of a BICS which was built to monitor the $I_{DDQ}$ current in the CUTs described below, and to provide a digital output proportional to the $I_{DDQ}$ ($I_{PS}$) current of the CUTs. The BICS comprises a current differential amplifier, current mirrors, and an inverter, and may be inserted in series with the power supply or the ground of CUTs to detect abnormal $I_{DDQ}$ currents in the CUTs, as shown in FIG. 1. The current differential amplifier receives one of its inputs from a reference current source ("$I_{REF}$") and the other from the CUT. The BICS operates in two modes (normal and test). In the normal mode, the BICS is totally isolated from the CUT, and avoids interfering with the normal operations of the CUT. When the $I_{DDQ}$ is greater than the $I_{REF}$, the current differential amplifier calculates the difference and the output signal PASS/FAIL is set to logic HIGH ('1'), indicating the existence of defects. When the $I_{DDQ}$ is less than the $I_{REF}$, the output signal PASS/FAIL is set to logic LOW ('0'), indicating the non-existence of defects. The BICS circuit has seven n-MOSFETs, a constant reference current source, and an inverter. The n-MOSFET ($Q_0$) is operated as a switch, either isolating or connecting the BICS to the CUT. See FIG. 3. In CMOS ICs, the peak $I_{DDQ}$ current (also referred to as "dynamic current" or "current spike") occurs when the inputs are switching. When a peak $I_{DDQ}$ current occurs in the input of the BICS (n-MOS current mirror) the current differential amplifier has no effect on dynamic current, since the switch transistor $Q_o$ is turned on. Therefore, the dynamic current does not affect BICS output. The n-MOS transistors $Q_1$ and $Q_2$ replicate the $I_{REF}$ from the constant current source. The current differential amplifier generates the difference current between the $I_{DEF}$ from the CUT and the $I_{REF}$ obtained from the constant current source. The drain of the n-MOS transistor $Q_4$ is connected to the input of the inverter to generate the PASS/FAIL signal. The $I_{REF}$ is equal to the fault free current when the CUT is fault-free. The BICS compares the $I_{REF}$ with $I_{DEF}$, and if the $I_{DEF}$ is greater than $I_{REF}$, then the BICS output shows logic HIGH ('1'). If the $I_{DEF}$ is less than $I_{REF}$, then the BICS output shows a logic LOW ('0').

Because the BICS is inserted between the $V_{SS}$ and the CUT, it causes a drop in the voltage. This effect causes performance degradation and ground-level shift. To reduce these effects BICS needs an extra pin EXT that is grounded in the normal mode and is floating in the testing mode.

A peak $I_{DDQ}$ current will flow in the CUT when there is an input transition. This current is ignored by the BICS because the BICS is designed to detect faulty current rather than current caused by input transitions. To prevent the BICS from detecting the peak current, a $V_{ENABLE}$ pin is used. In the normal mode, the BICS is disabled. This is achieved by connecting the $V_{ENABLE}$ to $V_{DD}$ and the EXT pin to the $V_{SS}$ to avoid any disturbance or low level shift during the normal mode of operation. In the testing mode, the EXT pin is floating and the $V_{ENABLE}$ is connected to $V_{SS}$ to enable the BICS. If there is any defect, the PASS/FAIL indicates logic HIGH. During the input transition, $V_{ENABLE}$ is connected to $V_{DD}$. Thus, the BICS will not detect the peak current during the transition, and the PASS/FAIL signal will remain low. For the BICS to switch between the normal mode and the test mode, the gate width (W) and channel length (L) size of the n-MOS transistor ($Q_o$) is set to 60 $\mu$m/1.6 $\mu$m. Also the W/L size of transistors ($Q_1$ and $Q_2$) forming the current mirror is set to 27 $\mu$m/1.6 $\mu$m, while the W/L size of the transistors ($Q_3$ and $Q_4$) is set to 72 $\mu$m/1.6 $\mu$m.

The following CMOS ICs were modified by inserting fault injectors (n-MOSFET transistors) at various locations within the circuits to simulate physical defects (e.g., gate-drain short, source-drain short, gate-source short and gate-oxide-substrate short) and detect abnormal $I_{DDQ}$ currents.

EXAMPLE 2

First Order Modulator Design

Figure 4A:
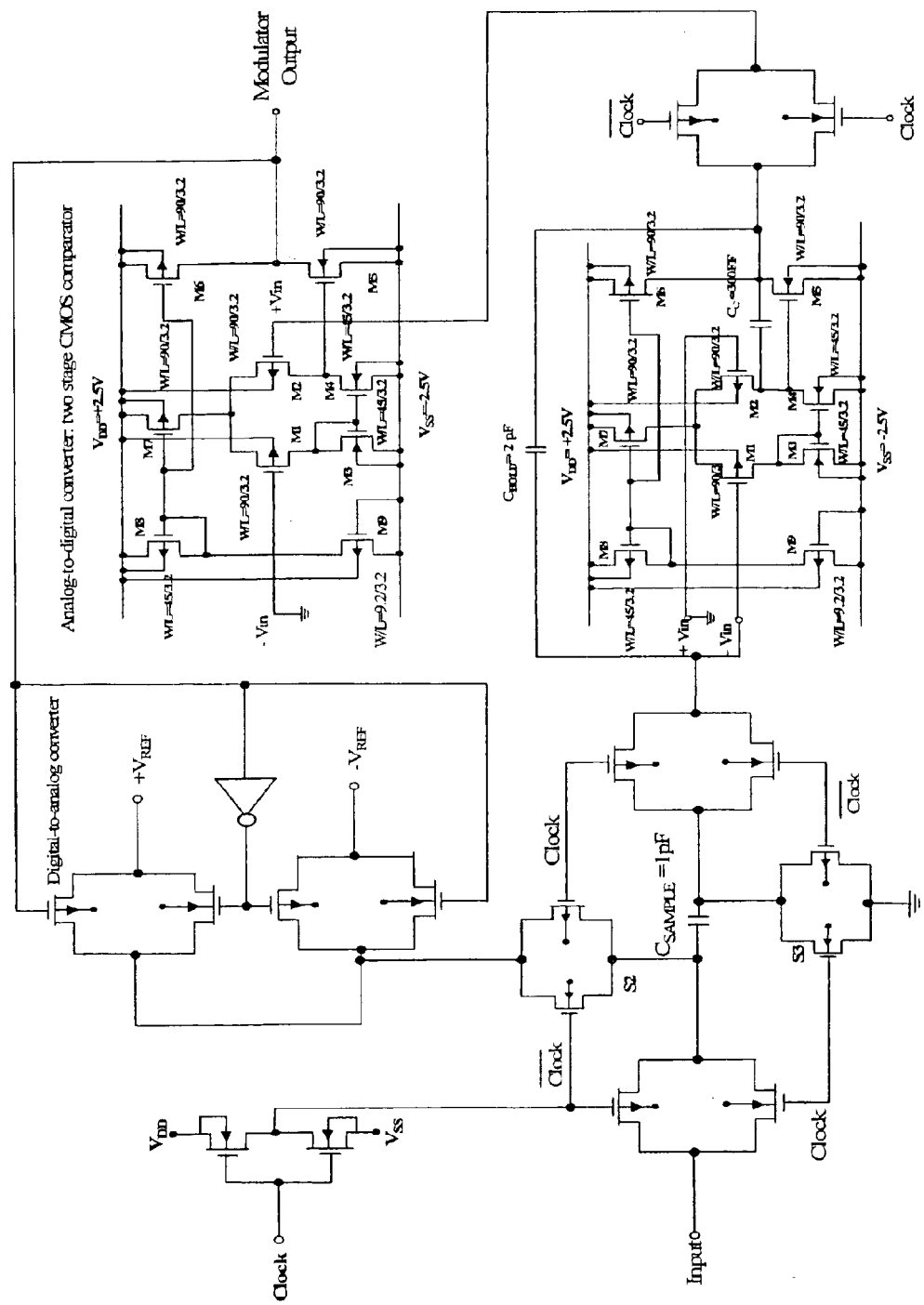
FIG. 4A illustrates a circuit level diagram of a first order modulator of an analog-to-digital converter with four critical bridging faults injected using one embodiment of the fault injector placed at different blocks in the modulator.
Figure 4B:
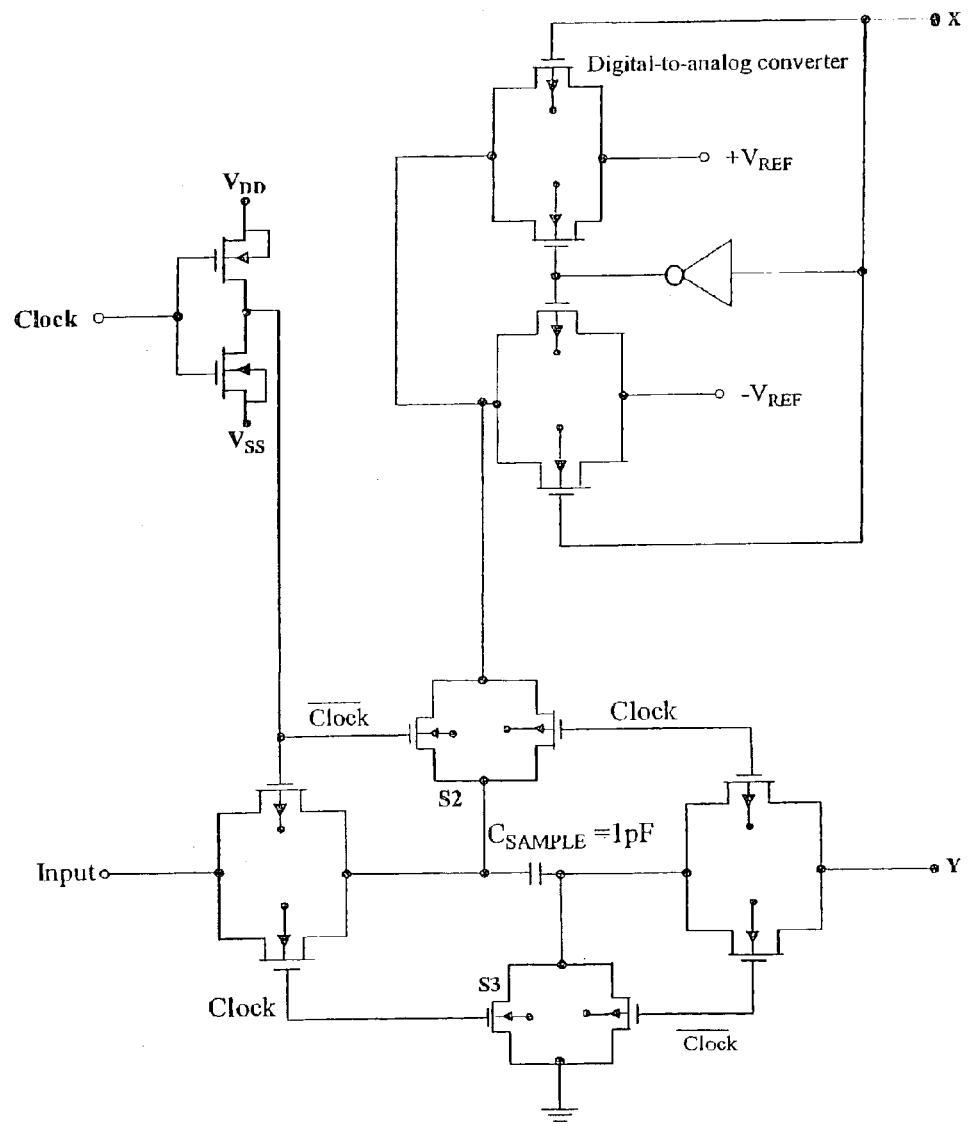
FIG. 4B illustrates a partial view of the left side of the circuit level diagram of a first order modulator of an analog-to-digital converter with four critical bridging faults as shown in FIG. 4A.
Figure 4C:
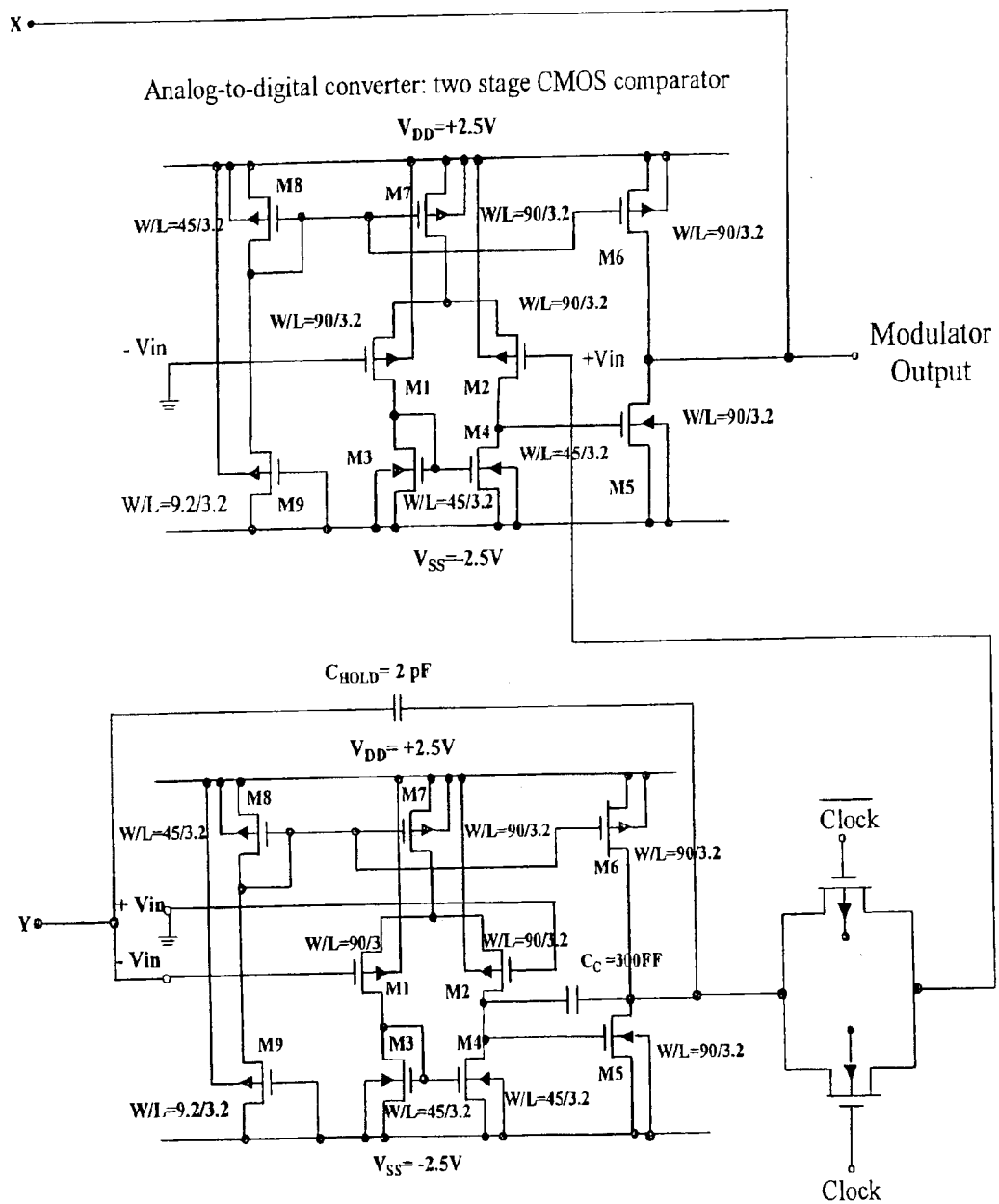
FIG. 4C illustrates a partial view of the right side of the circuit level diagram of a first order modulator of an analog-to-digital converter with four critical bridging faults as shown in FIG. 4A.

FIG. 4A illustrates a circuit level diagram of a first order (1-bit) modulator in accordance with the present invention. See FIGS. 4B and 4C that, when combined, form FIG. 4A. The 1-bit modulator comprises three major blocks, a switched capacitor integrator, a 1-bit ADC in the forward path, and a 1-bit DAC in the feedback path. To facilitate fault injection, each component further comprises a fault injector randomly placed between a pair of electrical nodes in each major block, as described in Example 1. The switched-capacitor integrator was a 2-stage CMOS amplifier. The 1-bit DAC was a 1-bit multiplexer with CMOS transmission gates. The 1-bit ADC was a 2-stage CMOS comparator. An analog input entered the modulator, wherein it was sampled at rates higher than the Nyquist rate (i.e., the minimum theoretical sampling rate that fully describes a given signal). The output was a high frequency 1-bit digital signal which used the analog input signal as its mean value. The output 1-bit signal was decimated to get an 8-bit digital output.

Figure 5:
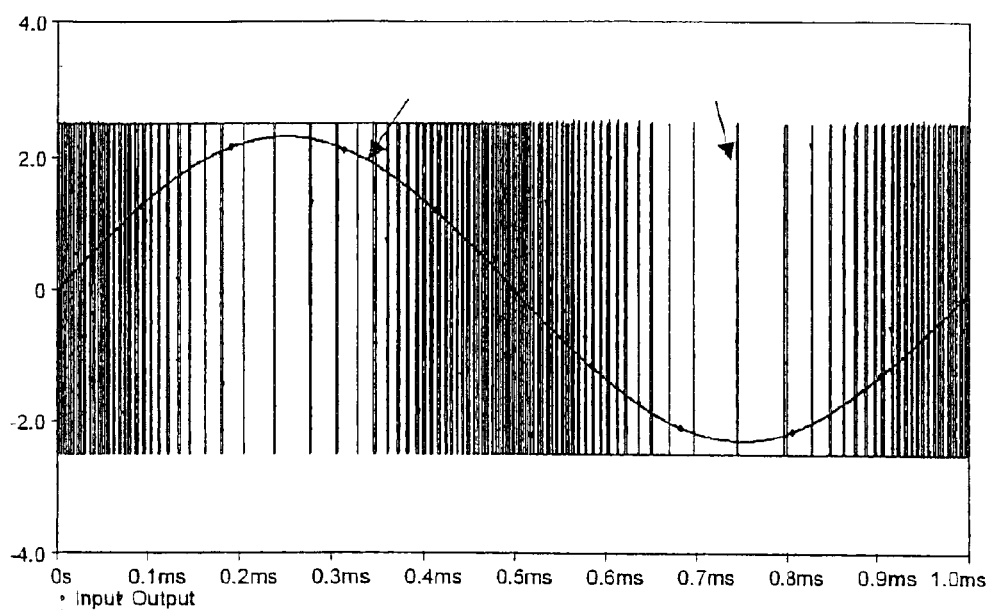
FIG. 5 illustrates input and output waveforms of a first order modulator.
Figure 6:
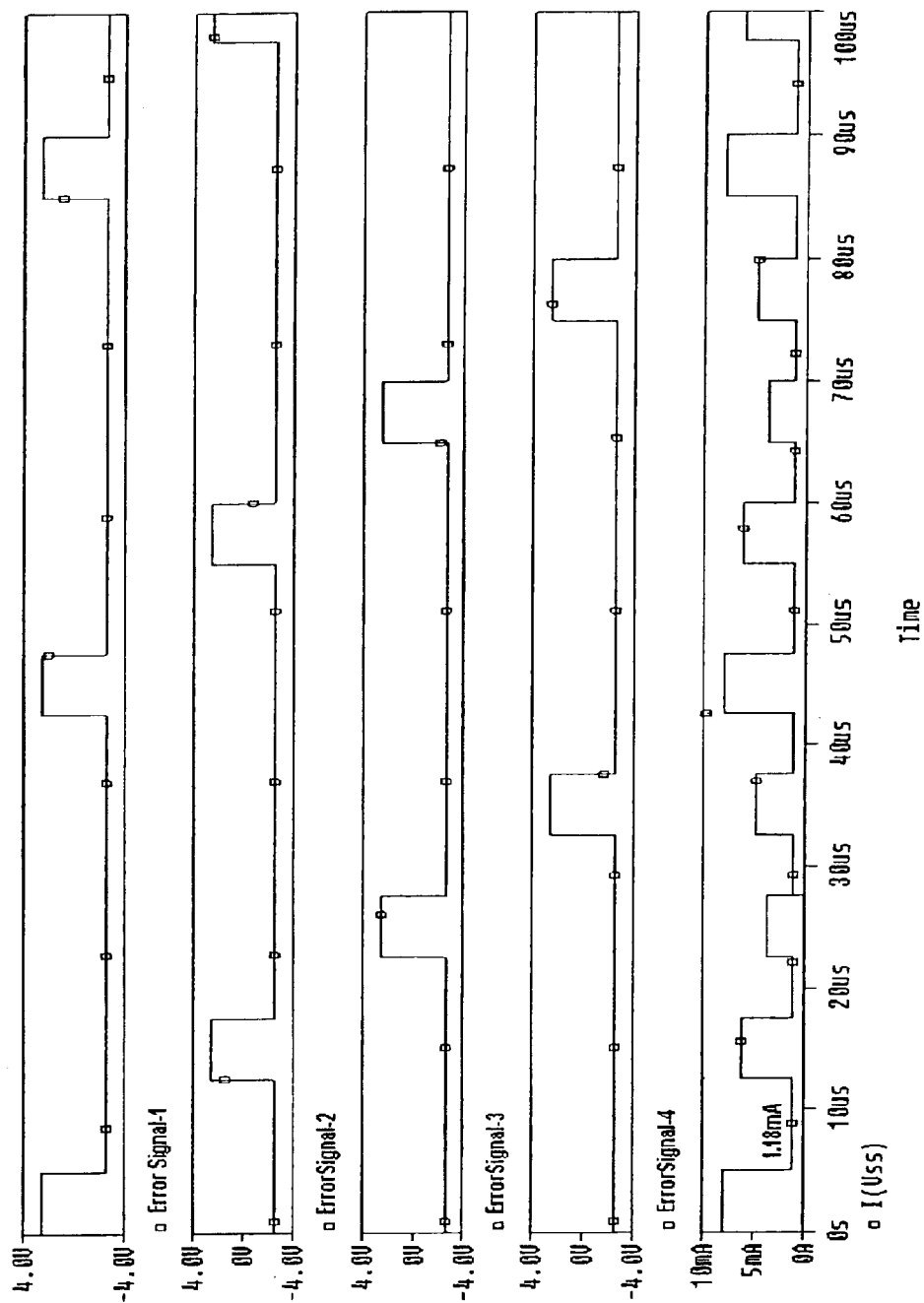
FIG. 6 illustrates simulation results showing defective current when defects are introduced into a first order modulator using one embodiment of the fault injector.
Figure 7:
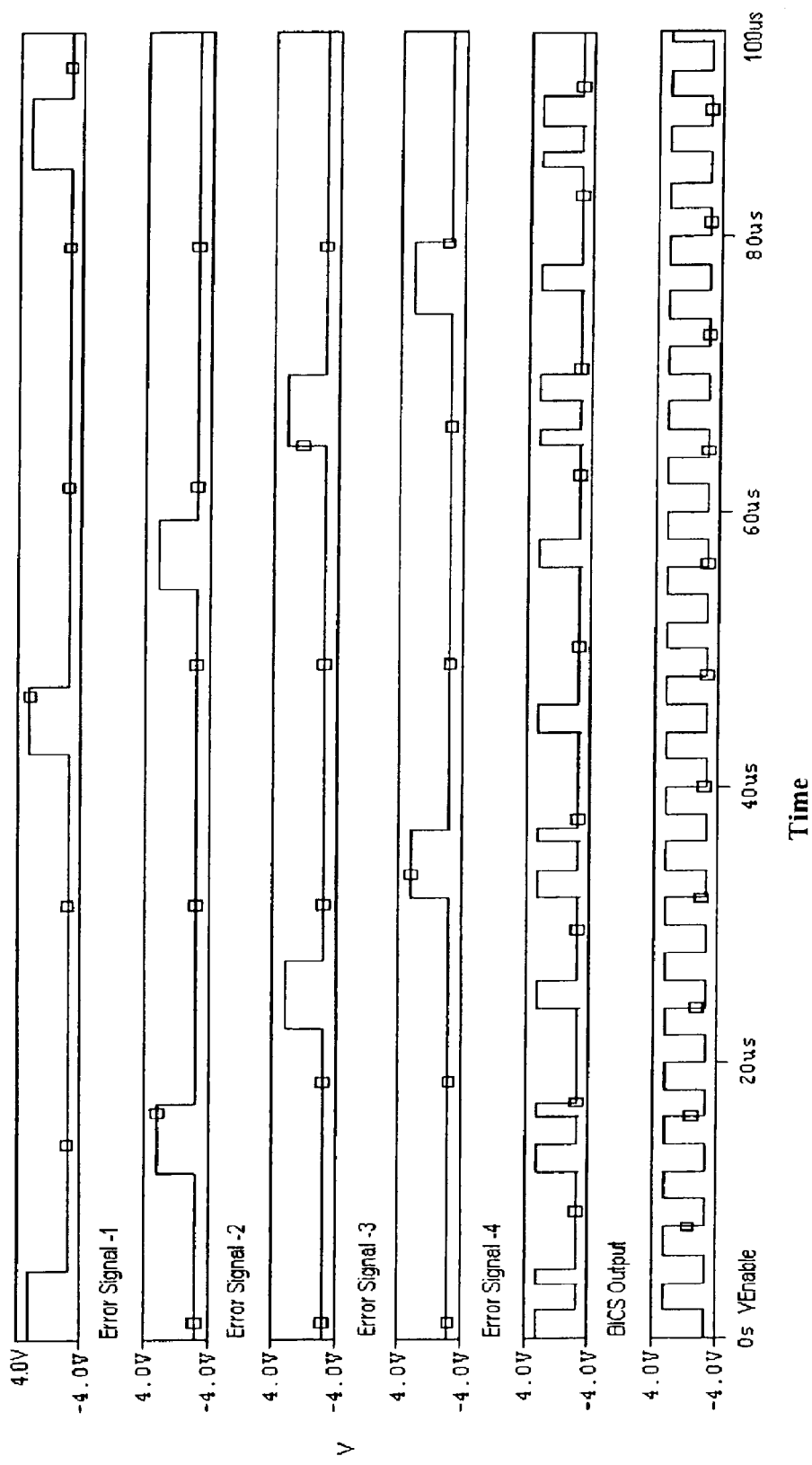
FIG. 7 illustrates simulation of BICS with defects introduced into a first order modulator with four critical bridging faults using one embodiment of the fault injectors.

FIG. 5 illustrates input and output waveforms of the 1-bit modulator obtained from a post-layout SPICE simulation using level-3 MOS model parameters. (SPICE is an industry standard circuit simulation program that determines the performance level of the circuit. It replaces components such as transistors with equivalent circuit models.) The modulator was designed for operation at a power supply of ±2.5 V. The sampling rate was 2 MHz, and the Nyquist rate was 30 KHz. Current under fault injections obtained from the SPICE simulations are shown in FIG. 6. The $I_{REF}$ was approximately 1 mA and the current under fault injection increased to 7 mA. The SPICE simulation results obtained from introducing defects using fault injection transistors are shown in FIG. 7. The $V_{ENABLE}$ signal enabled the BICS when it was LOW and disabled the BICS when it was HIGH. The PASS/FAIL signal was HIGH when the BICS was enabled and any of the error-signal was HIGH. The BICS was disabled during the input transition, and thus detected only the faulty current.

Figure 8:
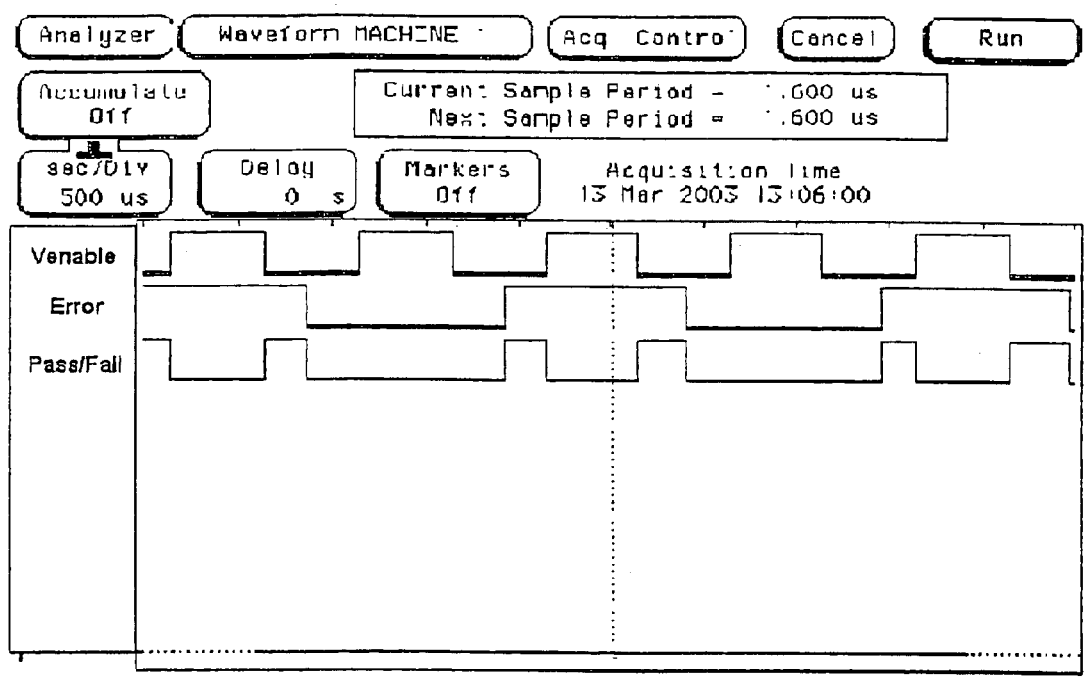
FIG. 8 illustrates test results showing BICS both in normal and test modes for a first order modulator.

Test results of the first order modulator using the BICS described in Example 1 are shown in FIG. 8. The results were obtained from an HP1660CS Logic Analyzer (Agilent Technologies, Palo Alto, Calif.). When $V_{ENABLE}$ signal was HIGH, the BICS was in the normal mode and the PASS/FAIL output showed a LOW value. When the $V_{ENABLE}$ signal was LOW, the BICS was in the test mode and the PASS/FAIL signal showed a HIGH value, depending upon the error-signal. A pulse was given to the error-signal to observe the workings of the BICS. The PASS/FAIL was HIGH when the error signal was HIGH, and LOW when the error signal was LOW. Thus, the BICS detected only the abnormal current caused by faults introduced by the fault-injectors.

EXAMPLE 3

10-Bit Charge Scaling DAC Design

Figure 9A:
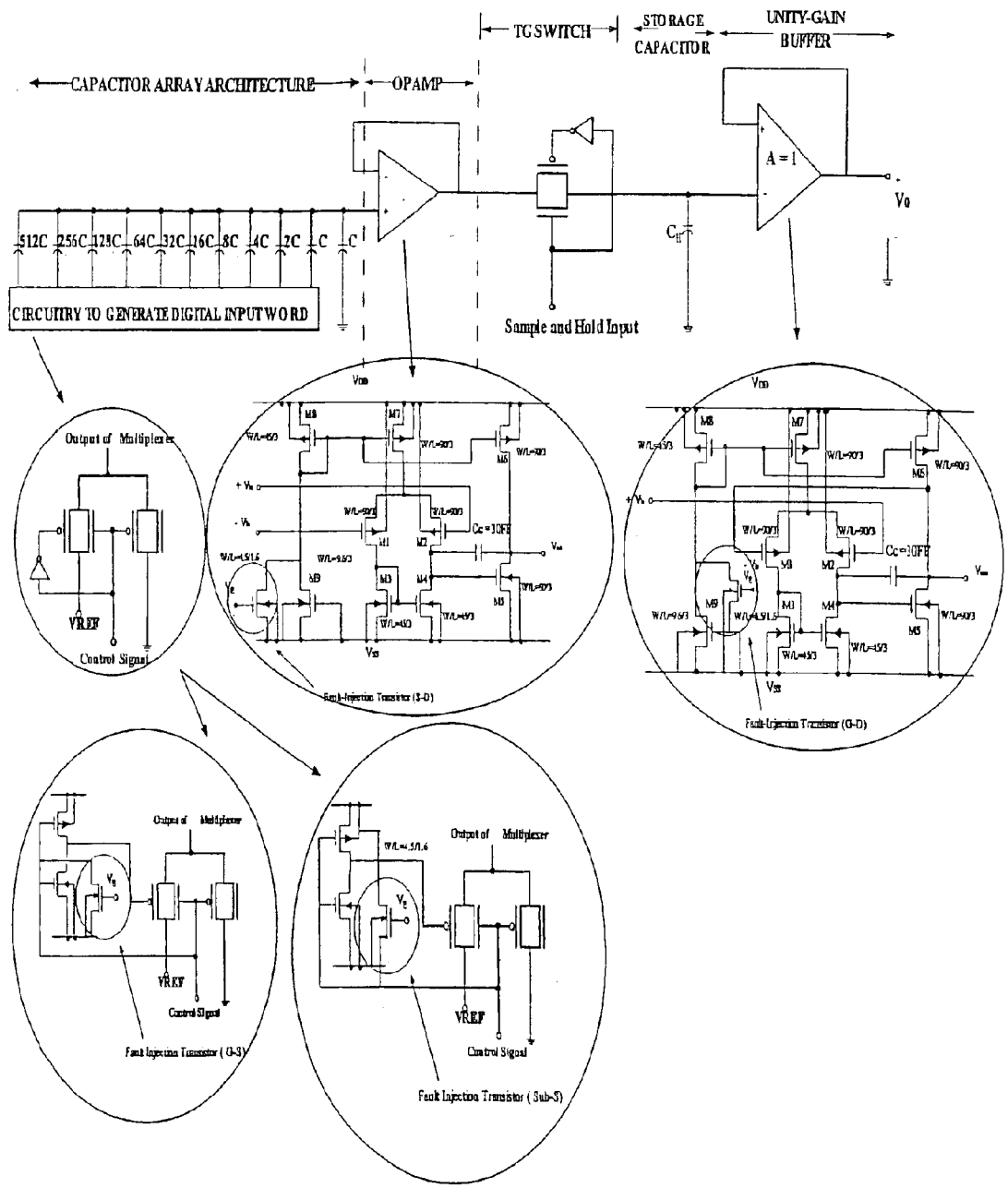
FIG. 9A illustrates a circuit level diagram of a 10-bit charge scaling digital-to-analog converter with four critical bridging faults injected using one embodiment of the fault injector place at different blocks within the digital-to-analog converter.
Figure 9B:
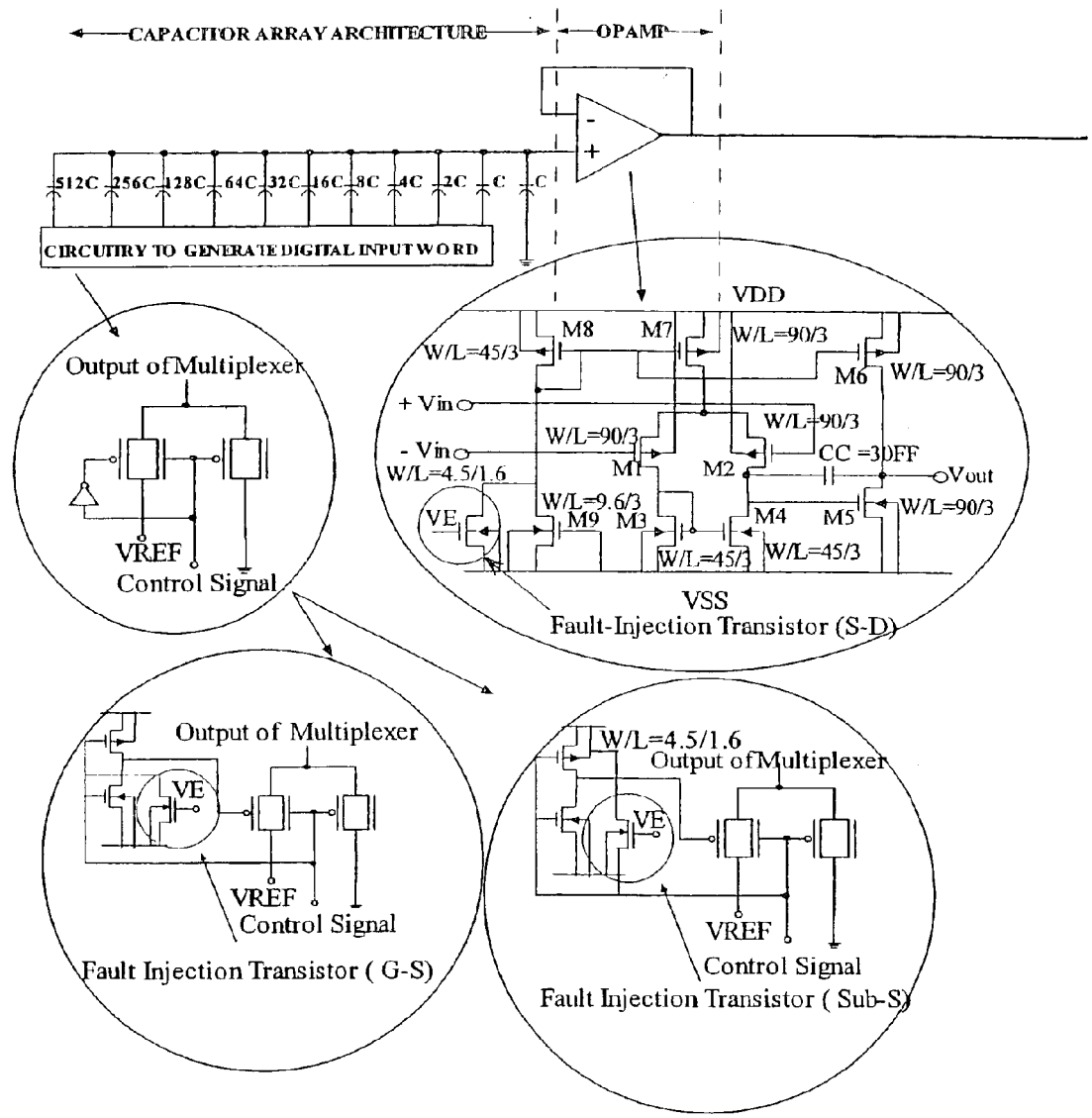
FIG. 9B illustrates a partial view of the left side of the circuit level diagram of a 10-bit charge scaling digital-to-analog converter with four critical bridging faults as shown in FIG. 9A.
Figure 9C:
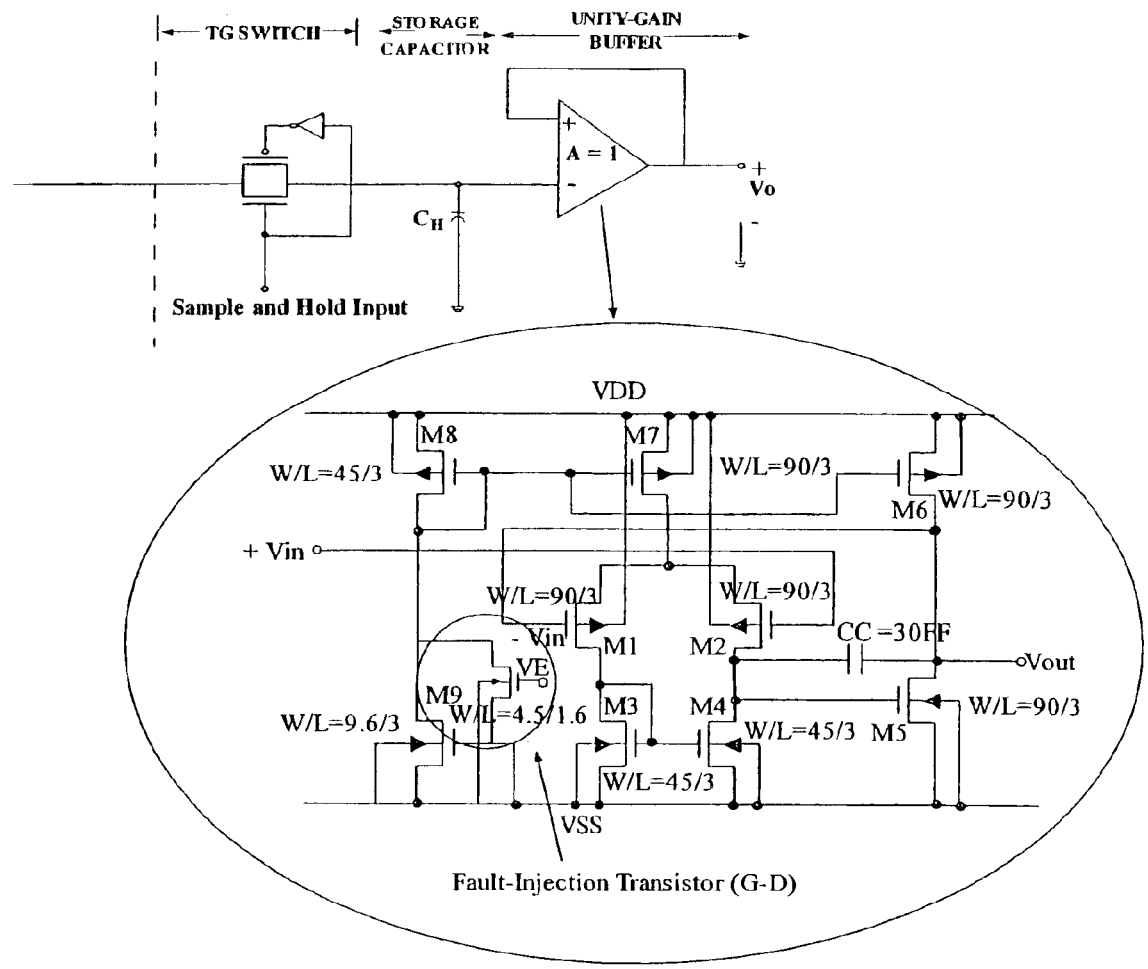
FIG. 9C illustrates a partial view of the right side of the circuit level diagram of a 10-bit charge scaling digital-to-analog converter with four critical bridging faults as shown in FIG. 9A.
Figure 10:
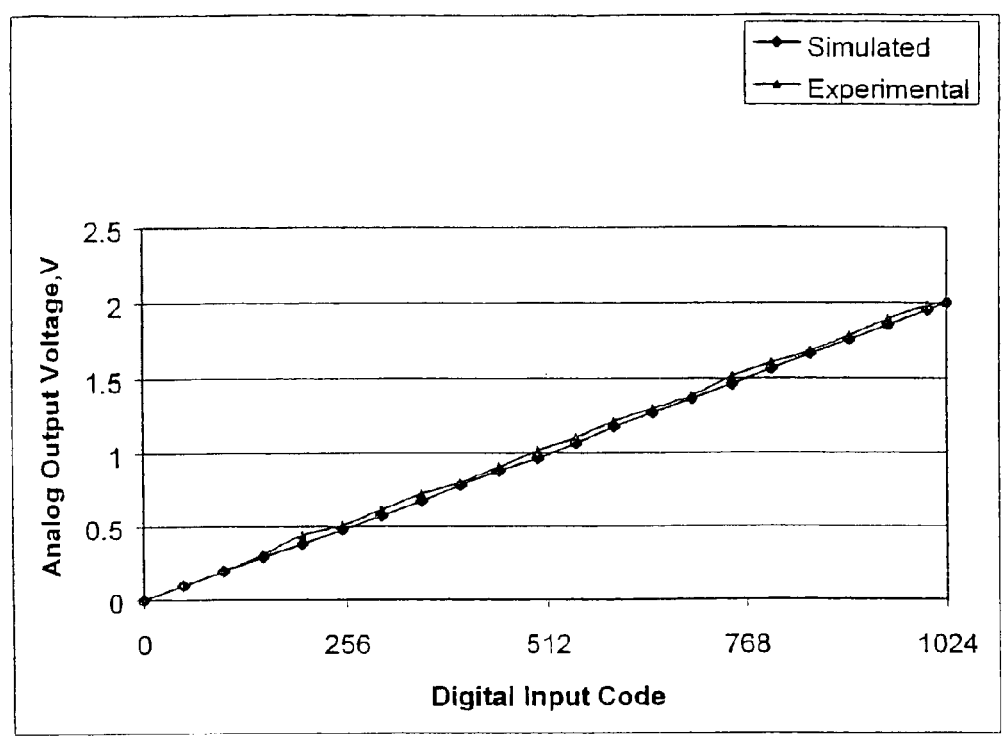
FIG. 10 illustrates measured and simulation program with integrated circuit emphasis, ("SPICE") simulated output characteristics of a 10-bit digital-to-analog converter.

FIG. 9A illustrates the circuit level diagram of a 10-bit charge scaling DAC, in accordance with this invention. See FIGS. 9B and 9C that, when combined, form FIG. 9A. The DAC comprises a plurality of voltage references (which may be eternally supplied), binary switches, a scaling network, an operational amplifier, and a sample and hold circuit. To facilitate fault injection, the DAC further comprises four fault injectors randomly placed between electrical nodes, as described in Example 1. The multiplexer circuit was connected to a first end of each capacitor, and a voltage was selected, either $V_{REF}$ or 'GND', for each capacitor, depending upon the control signal '$V_S$'. The multiplexer circuit, depending on the '$V_S$ and the capacitor network, produced a digital word, which was given to the DAC. The capacitors whose first end was connected to $V_{REF}$ were charged to +2 V, while those connected to 'GND' were charged to 0 V. Since the capacitor network was connected in parallel, the equivalent voltage was calculated by $$V_{OUT}=(b_1.2^{-1}+b_2.2^{-2}+b_3.2^{-3}+ \ldots +b_N.2^{-31\ N}).VREF \tag{1}$$

where $b_1 b_2 b_3 \ldots b_N$ constitute the binary word. The CMOS amplifier shown in FIG. 9 had two main stages. The first stage consisted of a differential amplifier. In this embodiment, P-MOSFETs were used for differential pair in design because p-MOSFETs have lower noise levels than n-MOSFETs. The differential amplifier was biased by a 100 A constant current source. The second stage provided a level shift for the output of the differential amplifier stage and the additional gain. It was again biased by a current source, which was also used to maximize the gain of the second stage. The amplifier was operated at a $V_{DD}$ of +2.5 V. The op-amp had an offset voltage of ~33 V and an open loop gain of ~81 dB. See FIG. 10.

Figure 11:
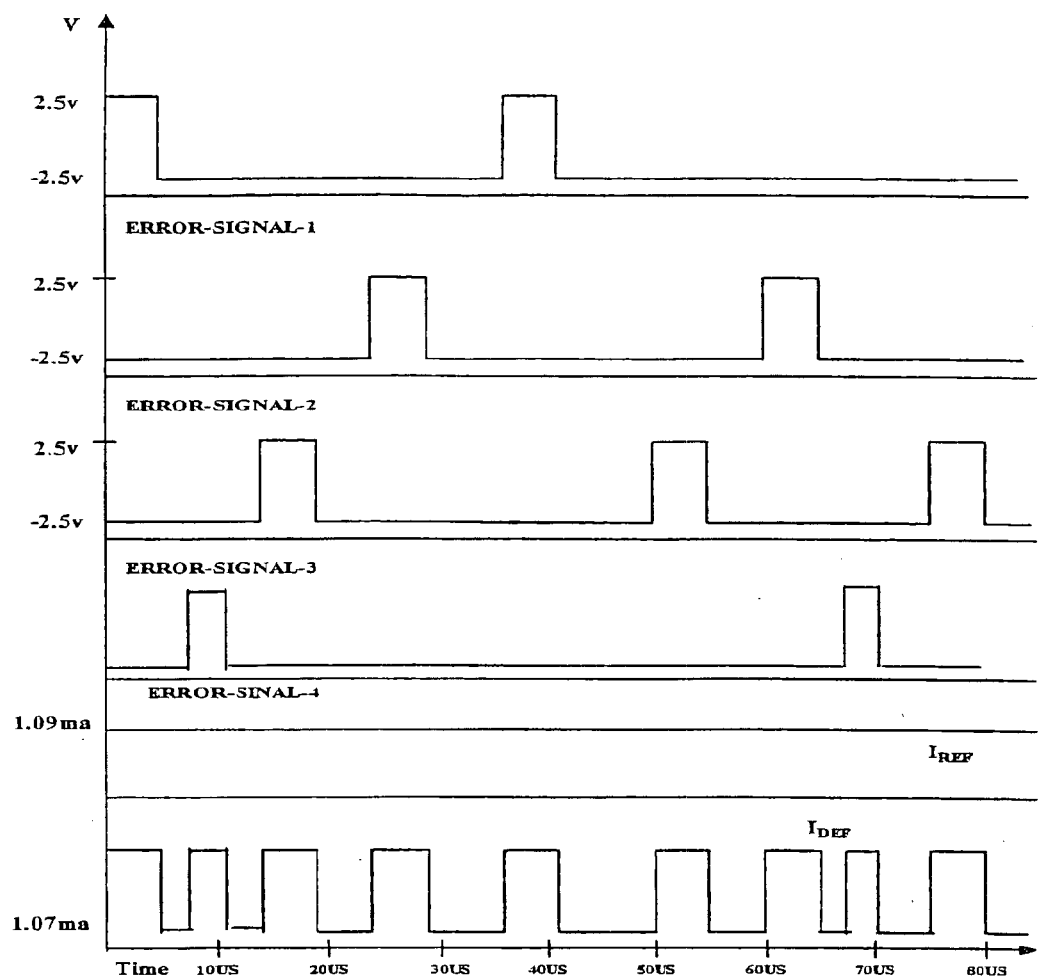
FIG. 11 illustrates simulation results showing defective current when defects are introduced into a digital-to-analog converter using one embodiment of the fault injector.

FIG. 11 illustrates defective current in the 10-bit DAC, which was detected by the BICS when the defects were introduced into the CUT by fault-injectors. The reference current was 1 mA. The defect free current in the circuit was 1 mA, but increased to 3 mA when the defects were introduced into the circuit.

Figure 12:
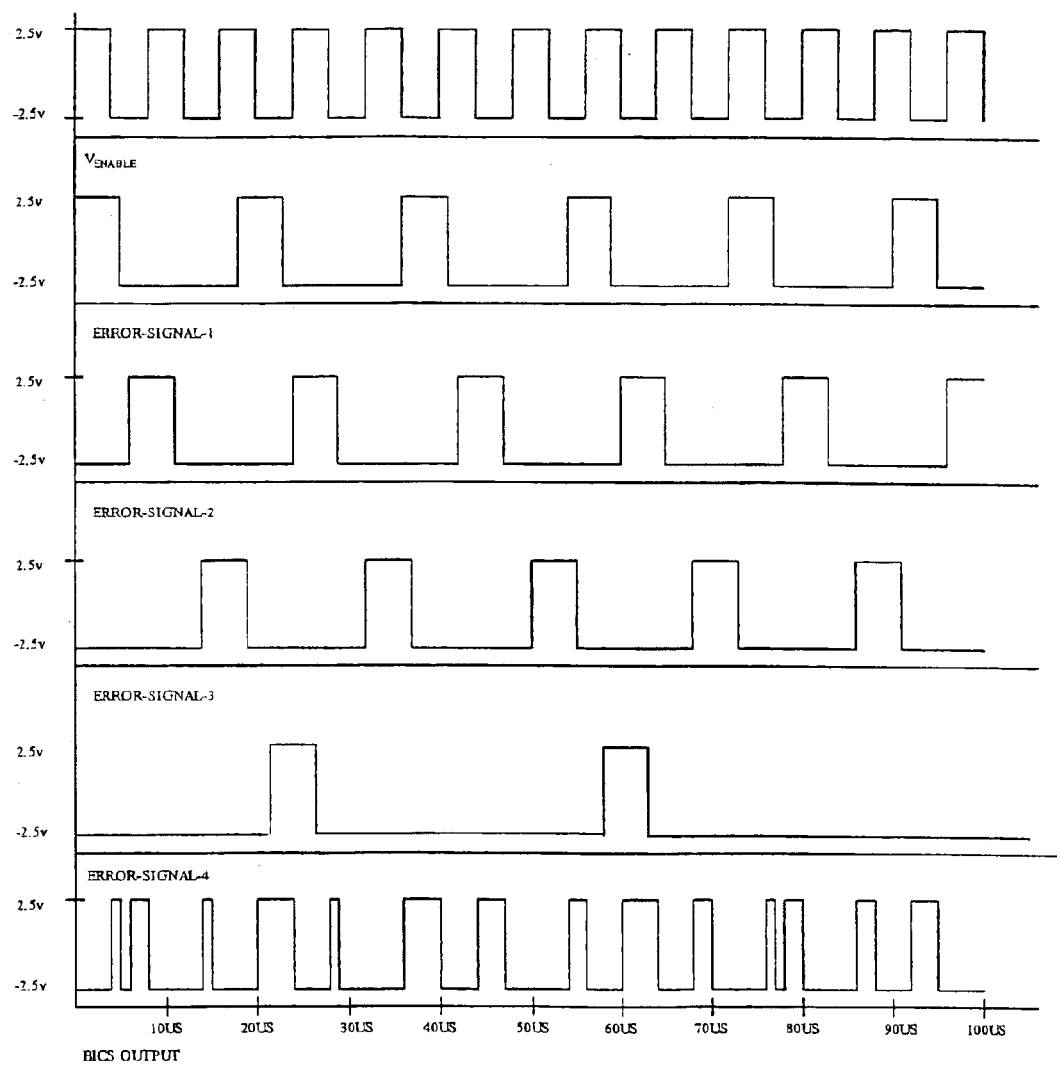
FIG. 12 illustrates a simulation of BICS with defects introduced into a 10-bit digital-to-analog converter using fault-injectors.

FIG. 12 illustrates the SPICE simulation results of the CUT when defects were induced through error signals using fault-injectors. The results indicate that the PASS/FAIL signal went HIGH only when the $V_{ENABLE}$ was LOW and any of the error signals was HIGH. When the $V_{ENABLE}$ signal was HIGH, the BICS was disabled and the PASS/FAIL signal remained LOW. Thus, the BICS detected abnormal current caused by the fault-injectors, except the peak of $I_{DDQ}$ current occurring in input transition.

Figure 13:
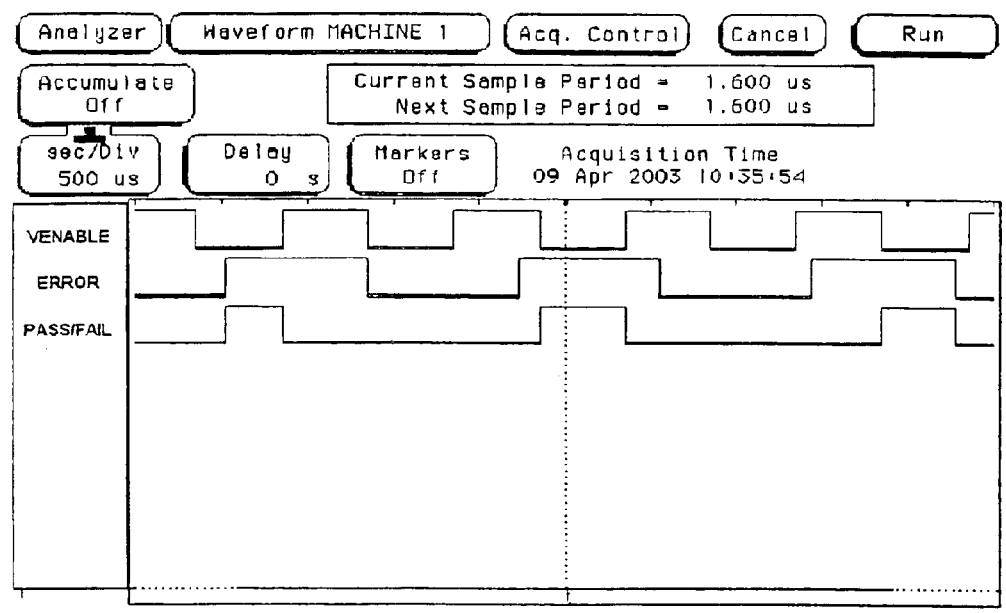
FIG. 13 illustrates test results showing BICS in normal and test modes for a 10-bit digital-to-analog converter.

FIG. 13 illustrates the test results of the 10-bit DAC with BICS in the normal and testing modes, which were measured using the HP1660CS Logic Analyzer. The error-signal was kept HIGH to show the effective working of BICS.

From the above tests, the following conclusions could be made. The use of the fault injectors and the BICS improved the testing of mixed signal ICs. The fault injectors were effective in inducing abnormal $I_{DDQ}$ currents into the CUTs which were detected by the BICS, while the CUT was operating in its functional capacity.

The complete disclosures of all references cited in this specification are hereby incorporated by reference. Also incorporated by reference is the complete disclosure of the following papers: A. Srivastava, et al., *A Novel Approach to $I_{DDQ}$ Testing of Mixed-Signal Integrated Circuits* (research report) presented at the 45$^{th}$ IEEE International Midwest Symposium on Circuits & Systems on Aug. 4–7, 2002; and A. Srivastava, et al., *Improved Fault Coverage of Combined Oscillation and IDDQ Testing of a CMOS Amplifier Circuit at Liquid Nitrogen Temperature* (research report) on file with the Louisiana State University Department of Electrical Engineering (May, 2004). In the event of an otherwise irreconcilable conflict, however, the present specification shall control.

Abbreviations & Acronyms (Singular & Plural Forms an Acronym are Spelled the Same):
ADC analog-to-digital converter
BICS built-in current sensor
BIST built-in self test
CMOS complementary MOS
CUT circuit under test
DAC digital to analog converter
DFT design for testability
IC integrated circuit
$I_{DDQ}$ quiescent state current
MOS metal oxide semiconductor

I claim:

1. A method for testing an integrated circuit comprising a power supply voltage, a ground, at least one pair of electrical nodes located in a section of the circuit to be tested, and at least one fault injector for completing an electrical path between the pair of electrical nodes; wherein the fault injector comprises a gate for operating the fault injector in an on-state or off-state condition, and a source node and a drain node for completing an electrical path between the pair of electrical nodes; the method comprising the steps of:

(a) introducing an electrical short between the pair of electrical nodes by supplying the gate with a gate voltage exceeding a threshold voltage that causes the fault injector to operate in an on-state condition;

(b) adjusting the frequency and length of time of the electrical short to simulate various physical defects that occur in integrated circuits by adjusting the gate voltage to a voltage ranging from about the threshold voltage to about the power supply voltage; wherein, if the gate voltage is increased, the resistance between the electrical nodes decreases; and if the gate voltage is decreased, the resistance between the electrical nodes increases; and (c) monitoring quiescent current levels in the integrated circuit using a built-in current sensor; wherein:

(d) when the gate voltage is less than about the threshold voltage, the fault injector remains in the off-state condition, and the integrated circuit performs normal operations without electrical interference; and when the gate voltage is between about the threshold voltage and about the supply voltage, the gate is switched to the on-state condition and the fault injector causes an electrical short between the electrical nodes such that the quiescent state current exceeds a predetermined reference current; if the quiescent state current exceeds the reference current, the built-in current sensor signals that a defect exists; and if the quiescent state current is less than the reference current, the built-in current sensor signals that no defect exists.

2. A method as recited in claim 1, wherein the integrated circuit is selected from the group consisting of CMOS analog, mixed-signal, and digital integrated circuits.

3. A method as recited in claim 1, wherein the physical defects simulated are selected from the group consisting of gate-drain, source-drain, gate-source, gate-oxide-substrate shorts, and internal bridging faults.

4. A method as recited in claim 1, wherein the threshold voltage is about 0.2 power supply voltage.

5. A method as recited in claim 1, wherein the fault injector is an n-channel MOS field effect transistor; wherein the power supply voltage is $V_{DD}$.

6. A method as recited in claim 1, wherein the fault injector is a p-channel MOS field effect transistor; wherein the power supply voltage is $V_{SS}$.

7. A method as recited in claim 1, wherein the built-in current sensor comprises a current differential amplifier, at least a first and second current mirror, and an inverter; wherein the inverter generates a defect status signal; and wherein the current differential amplifier determines whether a physical defect exists in the integrated circuit by calculating the difference between the reference current and quiescent state current supplied by the first current mirror, which is then transferred to the inverter by the second current mirror.

8. A method as recited in claim 1, wherein the method further comprises monitoring oscillation-based faults in the integrated circuit by converting the integrated circuit into an oscillator circuit.

9. A method as recited in claim 8, wherein the test speed of oscillator circuit is about 1 MHz.

10. A method as recited in claim 1, wherein the resistance between the electrical nodes ranges from about 50 ohms to about 500 ohms.

* * * * *